United States Patent
Lomayev et al.

(10) Patent No.: US 10,659,193 B2
(45) Date of Patent: *May 19, 2020

(54) APPARATUS, SYSTEM AND METHOD OF COMMUNICATING A TRANSMISSION ENCODED ACCORDING TO A LOW-DENSITY PARITY-CHECK (LDPC) CODE

(71) Applicant: INTEL CORPORATION, Santa Clara, CA (US)

(72) Inventors: Artyom Lomayev, Nizhny Novgorod (RU); Iaroslav P. Gagiev, Nizhny Novgorod (RU); Alexander Maltsev, Nizhny Novgorod (RU); Michael Genossar, Modiin (IL); Carlos Cordeiro, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/125,709

(22) Filed: Sep. 9, 2018

(65) Prior Publication Data

US 2019/0140773 A1 May 9, 2019

Related U.S. Application Data

(63) Continuation of application No. 15/388,187, filed on Dec. 22, 2016, now Pat. No. 10,097,314.

(Continued)

(51) Int. Cl.
*H03M 13/00* (2006.01)
*H04L 1/00* (2006.01)
(Continued)

(52) U.S. Cl.
CPC ....... *H04L 1/0058* (2013.01); *H03M 13/1102* (2013.01); *H03M 13/116* (2013.01);
(Continued)

(58) Field of Classification Search
CPC ... H04L 1/0058; H04L 1/0041; H04B 7/0413; H04B 7/0452; H03M 13/1102; H03M 13/616
See application file for complete search history.

(56) References Cited

U.S. PATENT DOCUMENTS

| | | |
|---|---|---|
| 10,097,314 B2 | 10/2018 | Lomayev et al. |
| 2007/0101229 A1 | 5/2007 | Niu et al. |
| 2007/0291938 A1* | 12/2007 | Rao ........................ G09G 5/006 380/210 |
| 2018/0019840 A1 | 1/2018 | Lomayev et al. |

OTHER PUBLICATIONS

IEEE Std 802.11™-2012. IEEE Standard for Information technology—Telecommunications and information exchange between systems Local and metropolitan area networks—Specific requirements Part 11: Wireless LAN Medium Access Control (MAC) and Physical Layer (PHY) Specifications, Mar. 29, 2012, 2793 pages.

(Continued)

*Primary Examiner* — Samir W Rizk
(74) *Attorney, Agent, or Firm* — Shichrur & Co.

(57) ABSTRACT

Some demonstrative embodiments include apparatus, system and method of communicating a transmission encoded according to a Low-Density Parity-Check (LDPC) code. For example, an apparatus may include logic and circuitry configured to cause a wireless station to encode a plurality of data bits into a plurality of codewords according to an LDPC code having an encoding rate of 7/8 and a codeword length of 1248 bits; and to transmit a transmission over a millimeter Wave (mmWave) frequency band based on the plurality of codewords.

24 Claims, 4 Drawing Sheets

Related U.S. Application Data

(60) Provisional application No. 62/363,287, filed on Jul. 17, 2016.

(51) Int. Cl.
  *H04B 7/0413* (2017.01)
  *H04B 7/0452* (2017.01)
  *H03M 13/11* (2006.01)
  *H03M 13/25* (2006.01)

(52) U.S. Cl.
  CPC ..... *H03M 13/616* (2013.01); *H03M 13/6362* (2013.01); *H03M 13/6516* (2013.01); *H04B 7/0413* (2013.01); *H04B 7/0452* (2013.01); *H04L 1/0041* (2013.01); *H04L 1/0045* (2013.01); *H04L 1/0057* (2013.01); *H04L 1/0068* (2013.01); *H03M 13/255* (2013.01)

(56) References Cited

OTHER PUBLICATIONS

IEEE Std 802.11ad™-2012. IEEE Standard for Information technology—Telecommunications and information exchange between systems Local and metropolitan area networks—Specific requirements Part 11: Wireless LAN Medium Access Control (MAC) and Physical Layer (PHY) Specifications Amendment 3: Enhancements for Very High Throughput in the 60 GHz Band, Dec. 28, 2012, 628 pages.

Office Action for U.S. Appl. No. 15/388,187, dated Jan. 22, 2018, 16 pages.

Notice of Allowance for U.S. Appl. No. 15/388,187, dated Jun. 6, 2018, 5 Pages.

* cited by examiner

US 10,659,193 B2

APPARATUS, SYSTEM AND METHOD OF COMMUNICATING A TRANSMISSION ENCODED ACCORDING TO A LOW-DENSITY PARITY-CHECK (LDPC) CODE

CROSS REFERENCE

This Application claims the benefit of and priority from U.S. Provisional Patent Application No. 62/363,287 entitled "APPARATUS, SYSTEM AND METHOD OF COMMUNICATING A TRANSMISSION ENCODED ACCORDING TO AN LDPC CODE", filed Jul. 17, 2016, the entire disclosure of which is incorporated herein by reference.

TECHNICAL FIELD

Embodiments described herein generally relate to communicating a transmission a transmission encoded according to a Low-Density Parity-Check (LDPC) code.

BACKGROUND

A wireless communication network in a millimeter-wave band may provide high-speed data access for users of wireless communication devices.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
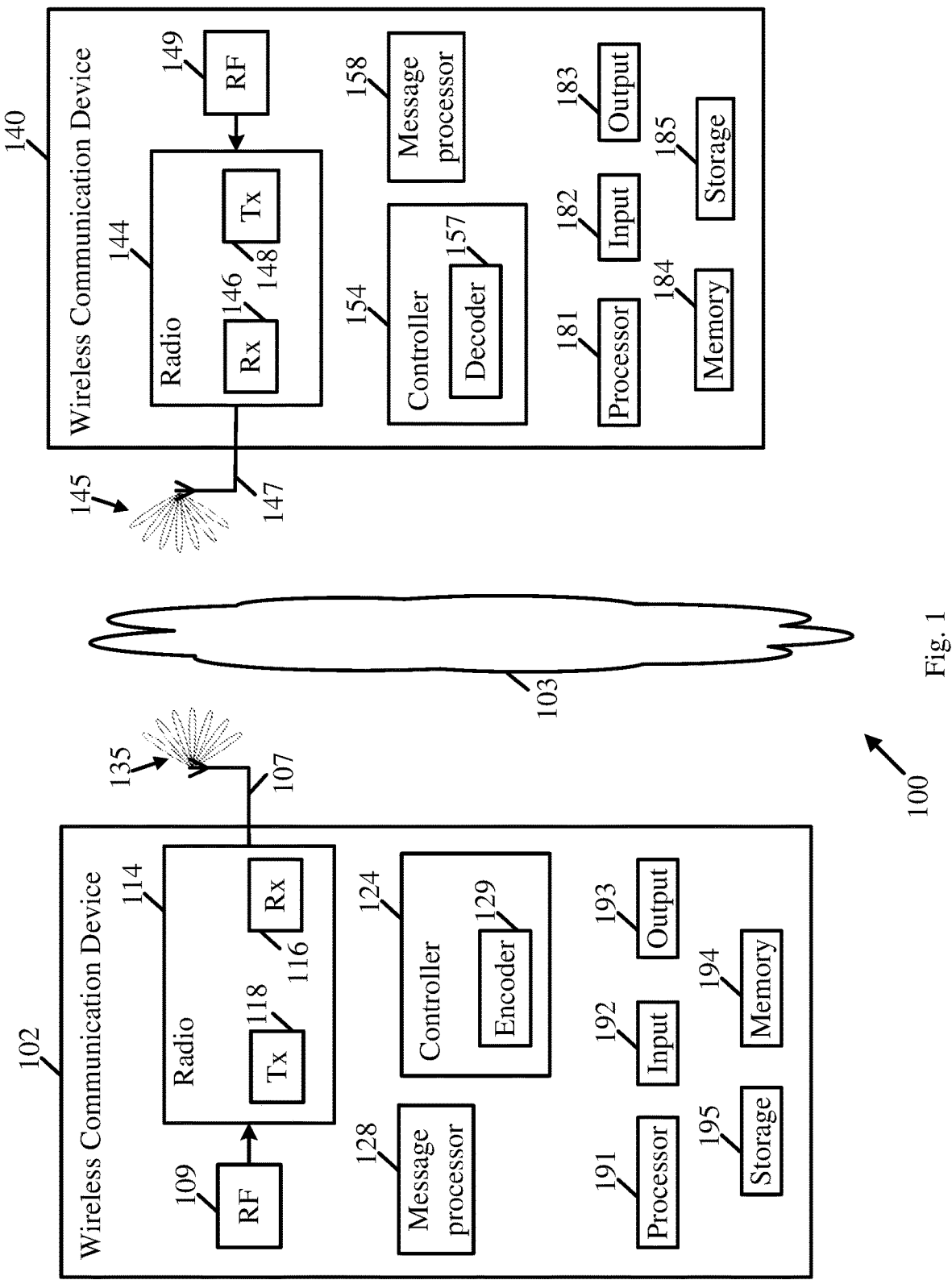
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a handheld device, a wearable device, a sensor device, an Internet of Things (IoT) device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with devices and/or networks operating in accordance with existing IEEE 802.11 standards (including IEEE 802.11-2012, *IEEE Standard for Information technology—Telecommunications and information exchange between systems Local and metropolitan area networks—Specific requirements Part 11: Wireless LAN Medium Access Control (MAC) and Physical Layer (PHY) Specifications*, Mar. 29, 2012; IEEE802.11ac-2013 ("*IEEE P802.11ac-2013, IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 4: Enhancements for Very High Throughput for Operation in Bands below 6 GHz"*, December, 2013); IEEE 802.11ad ("*IEEE P802.11ad-2012, IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 3: Enhancements for Very High Throughput in the 60 GHz Band"*, 28 Dec., 2012); IEEE-802.11REVmc ("*IEEE 802.11-REVmc™/D6.0, June 2016,* draft standard for Information technology—Telecommunications and information exchange between systems Local and metropolitan area networks Specific requirements; Part 11: Wireless LAN Medium Access Control (MAC) and Physical Layer (PHY) Specification"); IEEE802.11-ay (*P802.11ay Standard for Information Technology—Telecommunications and Information Exchange Between Systems Local and Metropolitan Area Networks—Specific Requirements Part 11: Wireless LAN Medium Access Control (MAC) and Physical Layer (PHY) Specifications—Amendment: Enhanced Throughput for Operation in License-Exempt Bands Above 45 GHz*)) and/or future versions and/or derivatives thereof, devices and/or networks operating in accordance with existing WiFi Alliance (WFA) Peer-to-Peer (P2P) specifications (including *WiFi P2P technical specification, version 1.5, Aug. 4, 2015*) and/or future versions and/or derivatives thereof, devices and/or networks operating in accordance with existing Wireless-Gigabit-Alliance (WGA) specifications (including *Wireless Gigabit Alliance, Inc WiGig MAC and PHY Specification Version 1.1, April 2011, Final specification*) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Orthogonal Frequency-Division Multiple Access (OFDMA), FDM Time-Division Multiplexing (TDM), Time-Division Multiple Access (TDMA), Multi-User MIMO (MU-MIMO), Spatial Division Multiple Access (SDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G), or Sixth Generation (6G) mobile networks, 3GPP, Long Term Evolution (LTE), LTE advanced, Enhanced Data rates for GSM Evolution (EDGE), or the like. Other embodiments may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device. The communication signal may be transmitted and/or received, for example, in the form of Radio Frequency (RF) communication signals, and/or any other type of signal.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

Some demonstrative embodiments may be used in conjunction with a WLAN, e.g., a WiFi network. Other embodiments may be used in conjunction with any other suitable wireless communication network, for example, a wireless area network, a "piconet", a WPAN, a WVAN and the like.

Some demonstrative embodiments may be used in conjunction with a wireless communication network communicating over a frequency band of 60 GHz. However, other embodiments may be implemented utilizing any other suitable wireless communication frequency bands, for example, an Extremely High Frequency (EHF) band (the millimeter wave (mmWave) frequency band), e.g., a frequency band within the frequency band of between 20 Ghz and 300 GHZ, a frequency band above 45 GHZ, a frequency band below 20 GHZ, e.g., a Sub 1 GHZ (S1G) band, a 2.4 GHz band, a 5 GHZ band, a WLAN frequency band, a WPAN frequency band, a frequency band according to the WGA specification, and the like.

The term "antenna", as used herein, may include any suitable configuration, structure and/or arrangement of one or more antenna elements, components, units, assemblies and/or arrays. In some embodiments, the antenna may implement transmit and receive functionalities using separate transmit and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

The phrases "directional multi-gigabit (DMG)" and "directional band" (DBand), as used herein, may relate to a frequency band wherein the Channel starting frequency is above 45 GHz. In one example, DMG communications may involve one or more directional links to communicate at a rate of multiple gigabits per second, for example, at least 1 Gigabit per second, e.g., at least 7 Gigabit per second, at least 30 Gigabit per second, or any other rate.

Some demonstrative embodiments may be implemented by a DMG STA (also referred to as a "mmWave STA (mSTA)"), which may include for example, a STA having a radio transmitter, which is capable of operating on a channel that is within the DMG band. The DMG STA may perform other additional or alternative functionality. Other embodiments may be implemented by any other apparatus, device and/or station.

Reference is made to FIG. 1, which schematically illustrates a system 100, in accordance with some demonstrative embodiments.

As shown in FIG. 1, in some demonstrative embodiments, system 100 may include one or more wireless communication devices. For example, system 100 may include a wireless communication device 102, a wireless communication device 140, and/or one more other devices.

In some demonstrative embodiments, devices 102 and/or 140 may include a mobile device or a non-mobile, e.g., a static, device.

For example, devices 102 and/or 140 may include, for example, a UE, an MD, a STA, an AP, a PC, a desktop computer, a mobile computer, a laptop computer, an Ultrabook™ computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a media player, a Smartphone, a television, a music player, or the like.

In some demonstrative embodiments, device 102 may include, for example, one or more of a processor 191, an input unit 192, an output unit 193, a memory unit 194, and/or a storage unit 195; and/or device 140 may include, for example, one or more of a processor 181, an input unit 182, an output unit 183, a memory unit 184, and/or a storage unit 185. Devices 102 and/or 140 may optionally include other suitable hardware components and/or software components. In some demonstrative embodiments, some or all of the components of one or more of devices 102 and/or 140 may be enclosed in a common housing or packaging, and may be interconnected or operably associated using one or more wired or wireless links. In other embodiments, components of one or more of devices 102 and/or 140 may be distributed among multiple or separate devices.

In some demonstrative embodiments, processor 191 and/or processor 181 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 may execute instructions, for example, of an Operating System (OS) of device 102 and/or of one or more suitable applications. Processor 181 may execute instructions, for example, of an Operating System (OS) of device 140 and/or of one or more suitable applications.

In some demonstrative embodiments, input unit 192 and/or input unit 182 may include, for example, a keyboard, a keypad, a mouse, a touch-screen, a touch-pad, a track-ball, a stylus, a microphone, or other suitable pointing device or input device. Output unit 193 and/or output unit 183 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 194 and/or memory unit 184 includes, for example, a Random Access Memory (RAM), a Read Only Memory (ROM), a Dynamic RAM (DRAM), a Synchronous DRAM (SDRAM), a flash memory, a volatile memory, a non-volatile memory, a cache memory, a buffer, a short term memory unit, a long term memory unit, or other suitable memory units. Storage unit 195 and/or storage unit 185 may include, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102. Memory unit 184 and/or storage unit 185, for example, may store data processed by device 140.

In some demonstrative embodiments, wireless communication devices 102 and/or 140 may be capable of communicating content, data, information and/or signals via a wireless medium (WM) 103. In some demonstrative embodiments, wireless medium 103 may include, for example, a radio channel, a cellular channel, an RF channel, a WiFi channel, an IR channel, a Bluetooth (BT) channel, a Global Navigation Satellite System (GNSS) Channel, and the like.

In some demonstrative embodiments, WM 103 may include one or more directional bands and/or channels. For example, WM 103 may include one or more millimeter-wave (mmWave) wireless communication bands and/or channels.

In some demonstrative embodiments, WM 103 may include one or more DMG channels. In other embodiments WM 103 may include any other directional channels.

In other embodiments, WM 103 may include any other type of channel over any other frequency band.

In some demonstrative embodiments, device 102 and/or device 140 may include one or more radios including circuitry and/or logic to perform wireless communication between devices 102, 140 and/or one or more other wireless communication devices. For example, device 102 may include at least one radio 114, and/or device 140 may include at least one radio 144.

In some demonstrative embodiments, radio 114 and/or radio 144 may include one or more wireless receivers (Rx) including circuitry and/or logic to receive wireless communication signals, RF signals, frames, blocks, transmission streams, packets, messages, data items, and/or data. For example, radio 114 may include at least one receiver 116, and/or radio 144 may include at least one receiver 146.

In some demonstrative embodiments, radio 114 and/or radio 144 may include one or more wireless transmitters (Tx) including circuitry and/or logic to transmit wireless communication signals, RF signals, frames, blocks, transmission streams, packets, messages, data items, and/or data. For example, radio 114 may include at least one transmitter 118, and/or radio 144 may include at least one transmitter 148.

In some demonstrative embodiments, radio 114 and/or radio 144, transmitters 118 and/or 148, and/or receivers 116 and/or 146 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like. For example, radio 114 and/or radio 144 may include or may be implemented as part of a wireless Network Interface Card (NIC), and the like.

In some demonstrative embodiments, radios 114 and/or 144 may be configured to communicate over a directional band, for example, an mmWave band, and/or any other band, for example, a 2.4 GHz band, a 5 GHz band, a S1G band, and/or any other band.

In some demonstrative embodiments, radios 114 and/or 144 may include, or may be associated with one or more, e.g., a plurality of, directional antennas.

In some demonstrative embodiments, device 102 may include one or more, e.g., a plurality of, directional antennas 107, and/or device 140 may include on or more, e.g., a plurality of, directional antennas 147.

Antennas 107 and/or 147 may include any type of antennas suitable for transmitting and/or receiving wireless communication signals, blocks, frames, transmission streams, packets, messages and/or data. For example, antennas 107 and/or 147 may include any suitable configuration, structure and/or arrangement of one or more antenna elements, components, units, assemblies and/or arrays. Antennas 107 and/or 147 may include, for example, antennas suitable for directional communication, e.g., using beamforming techniques. For example, antennas 107 and/or 147 may include a phased array antenna, a multiple element antenna, a set of switched beam antennas, and/or the like. In some embodiments, antennas 107 and/or 147 may implement transmit and receive functionalities using separate transmit and receive antenna elements. In some embodiments, antennas 107 and/or 147 may implement transmit and receive functionalities using common and/or integrated transmit/receive elements.

In some demonstrative embodiments, antennas 107 and/or 147 may include directional antennas, which may be steered to one or more beam directions. For example, antennas 107 may be steered to one or more beam directions 135, and/or antennas 147 may be steered to one or more beam directions 145.

In some demonstrative embodiments, antennas 107 and/or 147 may include and/or may be implemented as part of a single Phased Antenna Array (PAA).

In some demonstrative embodiments, antennas 107 and/or 147 may be implemented as part of a plurality of PAAs, for example, as a plurality of physically independent PAAs.

In some demonstrative embodiments, a PAA may include, for example, a rectangular geometry, e.g., including an integer number, denoted M, of rows, and an integer number, denoted N, of columns. In other embodiments, any other types of antennas and/or antenna arrays may be used.

In some demonstrative embodiments, antennas 107 and/or antennas 147 may be connected to, and/or associated with, one or more Radio Frequency (RF) chains.

In some demonstrative embodiments, device 102 may include one or more, e.g., a plurality of, RF chains 109 connected to, and/or associated with, antennas 107.

In some demonstrative embodiments, one or more of RF chains 109 may be includes as part of, and/or implemented as part of one or more elements of radio 114, e.g., as part of transmitter 118 and/or receiver 116.

In some demonstrative embodiments, device 140 may include one or more, e.g., a plurality of, RF chains 149 connected to, and/or associated with, antennas 147.

In some demonstrative embodiments, one or more of RF chains 149 may be includes as part of, and/or implemented as part of one or more elements of radio 144, e.g., as part of transmitter 148 and/or receiver 146.

In some demonstrative embodiments, device 102 may include a controller 124, and/or device 140 may include a controller 154. Controller 124 may be configured to perform and/or to trigger, cause, instruct and/or control device 102 to perform, one or more communications, to generate and/or communicate one or more messages and/or transmissions, and/or to perform one or more functionalities, operations and/or procedures between devices 102, 140 and/or one or more other devices; and/or controller 154 may be configured to perform, and/or to trigger, cause, instruct and/or control device 140 to perform, one or more communications, to generate and/or communicate one or more messages and/or transmissions, and/or to perform one or more functionalities, operations and/or procedures between devices 102, 140 and/or one or more other devices, e.g., as described below.

In some demonstrative embodiments, controllers 124 and/or 154 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, baseband (BB) circuitry and/or logic, a BB processor, a BB memory, Application Processor (AP) circuitry and/or logic, an AP processor, an AP memory, and/or any other circuitry and/or logic, configured to perform the functionality of controllers 124 and/or 154, respectively. Additionally or alternatively, one or more functionalities of controllers 124 and/or 154 may be implemented by logic, which may be executed by a machine and/or one or more processors, e.g., as described below.

In one example, controller 124 may include circuitry and/or logic, for example, one or more processors including circuitry and/or logic, to cause, trigger and/or control a wireless device, e.g., device 102, and/or a wireless station, e.g., a wireless STA implemented by device 102, to perform one or more operations, communications and/or functionalities, e.g., as described herein.

In one example, controller 154 may include circuitry and/or logic, for example, one or more processors including circuitry and/or logic, to cause, trigger and/or control a wireless device, e.g., device 140, and/or a wireless station, e.g., a wireless STA implemented by device 140, to perform one or more operations, communications and/or functionalities, e.g., as described herein.

In some demonstrative embodiments, device 102 may include a message processor 128 configured to generate, process and/or access one or messages communicated by device 102.

In one example, message processor 128 may be configured to generate one or more messages to be transmitted by device 102, and/or message processor 128 may be configured to access and/or to process one or more messages received by device 102, e.g., as described below.

In some demonstrative embodiments, device 140 may include a message processor 158 configured to generate, process and/or access one or messages communicated by device 140.

In one example, message processor 158 may be configured to generate one or more messages to be transmitted by device 140, and/or message processor 158 may be configured to access and/or to process one or more messages received by device 140, e.g., as described below.

In some demonstrative embodiments, message processors 128 and/or 158 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, BB circuitry and/or logic, a BB processor, a BB memory, AP circuitry and/or logic, an AP processor, an AP memory, and/or any other circuitry and/or logic, configured to perform the functionality of message processors 128 and/or 158, respectively. Additionally or alternatively, one or more functionalities of message processors 128 and/or 158 may be implemented by logic, which may be executed by a machine and/or one or more processors, e.g., as described below.

In some demonstrative embodiments, at least part of the functionality of message processor 128 may be implemented as part of radio 114, and/or at least part of the functionality of message processor 158 may be implemented as part of radio 144.

In some demonstrative embodiments, at least part of the functionality of message processor 128 may be implemented as part of controller 124, and/or at least part of the functionality of message processor 158 may be implemented as part of controller 154.

In other embodiments, the functionality of message processor 128 may be implemented as part of any other element of device 102, and/or the functionality of message processor 158 may be implemented as part of any other element of device 140.

In some demonstrative embodiments, at least part of the functionality of controller 124 and/or message processor 128 may be implemented by an integrated circuit, for example, a chip, e.g., a System on Chip (SoC). In one example, the chip or SoC may be configured to perform one or more functionalities of radio 114. For example, the chip or SoC may include one or more elements of controller 124, one or more elements of message processor 128, and/or one or more elements of radio 114. In one example, controller 124, message processor 128, and radio 114 may be implemented as part of the chip or SoC.

In other embodiments, controller 124, message processor 128 and/or radio 114 may be implemented by one or more additional or alternative elements of device 102.

In some demonstrative embodiments, at least part of the functionality of controller 154 and/or message processor 158 may be implemented by an integrated circuit, for example, a chip, e.g., a System on Chip (SoC). In one example, the chip or SoC may be configured to perform one or more functionalities of radio 144. For example, the chip or SoC may include one or more elements of controller 154, one or more elements of message processor 158, and/or one or more elements of radio 144. In one example, controller 154, message processor 158, and radio 144 may be implemented as part of the chip or SoC.

In other embodiments, controller 154, message processor 158 and/or radio 144 may be implemented by one or more additional or alternative elements of device 140.

In some demonstrative embodiments, device 102 and/or device 140 may include, operate as, perform the role of, and/or perform one or more functionalities of, one or more STAs. For example, device 102 may include at least one STA, and/or device 140 may include at least one STA.

In some demonstrative embodiments, device 102 and/or device 140 may include, operate as, perform the role of, and/or perform one or more functionalities of, one or more DMG STAs. For example, device 102 may include, operate as, perform the role of, and/or perform one or more functionalities of, at least one DMG STA, and/or device 140 may include, operate as, perform the role of, and/or perform one or more functionalities of, at least one DMG STA.

In other embodiments, devices 102 and/or 140 may include, operate as, perform the role of, and/or perform one or more functionalities of, any other wireless device and/or station, e.g., a WLAN STA, a WiFi STA, and the like.

In some demonstrative embodiments, device 102 and/or device 140 may be configured operate as, perform the role of, and/or perform one or more functionalities of, an access point (AP), e.g., a DMG AP, and/or a personal basic service set (PBSS) control point (PCP), e.g., a DMG PCP, for example, an AP/PCP STA, e.g., a DMG AP/PCP STA.

In some demonstrative embodiments, device 102 and/or device 140 may be configured to operate as, perform the role of, and/or perform one or more functionalities of, a non-AP STA, e.g., a DMG non-AP STA, and/or a non-PCP STA, e.g., a DMG non-PCP STA, for example, a non-AP/PCP STA, e.g., a DMG non-AP/PCP STA.

In other embodiments, device 102 and/or device 140 may operate as, perform the role of, and/or perform one or more functionalities of, any other additional or alternative device and/or station.

In one example, a station (STA) may include a logical entity that is a singly addressable instance of a medium access control (MAC) and physical layer (PHY) interface to the wireless medium (WM). The STA may perform any other additional or alternative functionality.

In one example, an AP may include an entity that contains a station (STA), e.g., one STA, and provides access to distribution services, via the wireless medium (WM) for associated STAs. The AP may perform any other additional or alternative functionality.

In one example, a personal basic service set (PBSS) control point (PCP) may include an entity that contains a STA, e.g., one station (STA), and coordinates access to the wireless medium (WM) by STAs that are members of a PBSS. The PCP may perform any other additional or alternative functionality.

In one example, a PBSS may include a directional multi-gigabit (DMG) basic service set (BSS) that includes, for example, one PBSS control point (PCP). For example, access to a distribution system (DS) may not be present, but, for example, an intra-PBSS forwarding service may optionally be present.

In one example, a PCP/AP STA may include a station (STA) that is at least one of a PCP or an AP. The PCP/AP STA may perform any other additional or alternative functionality.

In one example, a non-AP STA may include a STA that is not contained within an AP. The non-AP STA may perform any other additional or alternative functionality.

In one example, a non-PCP STA may include a STA that is not a PCP. The non-PCP STA may perform any other additional or alternative functionality.

In one example, a non PCP/AP STA may include a STA that is not a PCP and that is not an AP. The non-PCP/AP STA may perform any other additional or alternative functionality.

In some demonstrative embodiments devices 102 and/or 140 may be configured to communicate over a Next Generation 60 GHz (NG60) network, an Extended DMG (EDMG) network, and/or any other network. For example, devices 102 and/or 140 may perform Multiple-Input-Multiple-Output (MIMO) communication, for example, for communicating over the NG60 and/or EDMG networks, e.g., over an NG60 or an EDMG frequency band.

In some demonstrative embodiments, devices 102 and/or 140 may be configured to operate in accordance with one or more Specifications, for example, including, one or more *IEEE* 802.11 *Specifications*, e.g., an *IEEE* 802.11*ad Specification*, an *IEEE* 802.11*REVmc Specification*, an *IEEE* 802.11*ay Specification*, and/or any other specification and/or protocol.

Some demonstrative embodiments may be implemented, for example, as part of a new standard in an mmWave band, e.g., a 60 GHz frequency band or any other directional band, for example, as an evolution of an *IEEE* 802.11*ad Specification*.

In some demonstrative embodiments, devices 102 and/or 140 may be configured according to one or more standards, for example, in accordance with an *IEEE* 802.11*ay Standard*, which may be, for example, configured to enhance the efficiency and/or performance of an *IEEE* 802.11*ad Specification*, which may be configured to provide Wi-Fi connectivity in a 60 GHz band.

Some demonstrative embodiments may enable, for example, to significantly increase the data transmission rates defined in the *IEEE* 802.11*ad Specification*, for example, from 7 Gigabit per second (Gbps), e.g., up to 30 Gbps, or to any other data rate, which may, for example, satisfy growing demand in network capacity for new coming applications.

Some demonstrative embodiments may be implemented, for example, to allow increasing a transmission data rate, for example, by applying MIMO and/or channel bonding techniques.

In some demonstrative embodiments, devices 102 and/or 140 may be configured to communicate MIMO communications over the mmWave wireless communication band.

In some demonstrative embodiments, device 102 and/or device 140 may be configured to support one or more mechanisms and/or features, for example, channel bonding, Single User (SU) MIMO, and/or Multi-User (MU) MIMO, for example, in accordance with an *IEEE* 802.11*ay Standard* and/or any other standard and/or protocol.

In some demonstrative embodiments, device 102 and/or device 140 may include, operate as, perform a role of, and/or perform the functionality of, one or more EDMG STAs. For example, device 102 may include, operate as, perform a role of, and/or perform the functionality of, at least one EDMG STA, and/or device 140 may include, operate as, perform a role of, and/or perform the functionality of, at least one EDMG STA.

In some demonstrative embodiments, devices 102 and/or 140 may implement a communication scheme, which may include Physical layer (PHY) and/or Media Access Control (MAC) layer schemes, for example, to support one or more applications, and/or increased transmission data rates, e.g., data rates of up to 30 Gbps, or any other data rate.

In some demonstrative embodiments, the PHY and/or MAC layer schemes may be configured to support frequency channel bonding over a mmWave band, e.g., over a 60 GHz band, SU MIMO techniques, and/or MU MIMO techniques.

In some demonstrative embodiments, devices 102 and/or 140 may be configured to implement one or more mechanisms, which may be configured to enable SU and/or MU communication of Downlink (DL) and/or Uplink frames (UL) using a MIMO scheme.

In some demonstrative embodiments, device 102 and/or device 140 may be configured to implement one or more MU communication mechanisms. For example, devices 102 and/or 140 may be configured to implement one or more MU mechanisms, which may be configured to enable MU communication of DL frames using a MIMO scheme, for example, between a device, e.g., device 102, and a plurality of devices, e.g., including device 140 and/or one or more other devices.

In some demonstrative embodiments, devices 102 and/or 140 may be configured to communicate over an NG60 network, an EDMG network, and/or any other network and/or any other frequency band. For example, devices 102 and/or 140 may be configured to communicate DL MIMO transmissions and/or UL MIMO transmissions, for example, for communicating over the NG60 and/or EDMG networks.

Some wireless communication specifications, for example, the *IEEE* 802.11*ad-2012 Specification*, may be configured to support a SU system, in which a STA may transmit frames to a single STA at a time. Such Specifications may not be able, for example, to support a STA transmitting to multiple STAs simultaneously, for example, using a MU-MIMO scheme, e.g., a DL MU-MIMO, or any other MU scheme.

In some demonstrative embodiments, devices 102 and/or 140 may be configured to implement one or more mechanisms, which may, for example, enable to extend a single-channel BW scheme, e.g., a scheme in accordance with the IEEE 802.11ad Specification or any other scheme, for higher data rates and/or increased capabilities, e.g., as described below.

In some demonstrative embodiments, devices 102 and/or 140 may be configured to implement one or more channel bonding mechanisms, which may, for example, support communication over bonded channels.

In some demonstrative embodiments, the channel bonding mechanisms may include, for example, a mechanism and/or an operation whereby two or more channels can be combined, e.g., for a higher bandwidth of packet transmission, for example, to enable achieving higher data rates, e.g., when compared to transmissions over a single channel. Some demonstrative embodiments are described herein with respect to communication over a bonded channel, however other embodiments may be implemented with respect to communications over a channel, e.g., a "wide" channel, including or formed by two or more channels, for example, an aggregated channel including an aggregation of two or more channels.

In some demonstrative embodiments, device 102 and/or device 140 may be configured to implement one or more channel bonding mechanisms, which may, for example, support an increased channel bandwidth, for example, a channel BW of 4.32 GHz, a channel BW of 6.48 GHz, and/or any other additional or alternative channel BW.

In some demonstrative embodiments, devices 102 and/or 140 may be configured to implement, for example, in addition to, or instead of, one or more MIMO and/or channel bonding techniques, a Physical layer (PHY) feature of a Low-Density Parity-Check (LDPC) code, for example, with an extended LDPC codeword length. For example, implementing an LDPC code with a longer codeword may provide better performance than an LDPC code with a shorter codeword length, e.g., under an assumption of the same encoding rate.

In some demonstrative embodiments, an LDPC code may use an extended codeword length, for example, a codeword length of 1344 bits, which may be two times longer than a codeword length ("legacy codeword length"), e.g., a codeword length of 672 bits, which may be utilized according to an IEEE 802.11ad Specification.

For example, an approach of an LDPC code with the extended codeword length, e.g., as may be adopted by a future IEEE 802.11ay Specification, may be implemented, for example, using lifting matrices to produce an LDPC check parity matrix with extended dimensions, e.g., as described below.

In some demonstrative embodiments, defining matrices for one or more encoding rates, for example, for the encoding rates 1/2, 5/8, 3/4, and 13/16, may not be enough. For example, such an approach may not cover, and/or may not be compatible with, an encoding rate of 7/8, which may be compatible with a legacy codeword length, e.g., in accordance with an IEEE 802.11ad Specification.

For example, the coding rate of 7/8, e.g., in compliance with an IEEE 802.11ad Specification development, utilizes an LDPC codeword length of 624 bits. The introduction of this encoding rate and corresponding Modulation and Coding Schemes (MCSs) may allow, for example, achieving a more efficient implementation of a link adaptation algorithm and, accordingly, may improve or optimize overall system performance.

For example, a code with the code rate of 7/8 may be obtained by application of a puncturing procedure to an LDPC code ("initial LDPC code"), for example, with a codeword length of 672 bits and an encoding rate of 13/16, e.g., as described below.

In some demonstrative embodiments, the puncturing procedure may puncture the first 48 parity bits of the initial LDPC code, for example, to achieve a required ratio of a systematic data part equal to 546 bits as for the initial 13/16 LDPC code, and a reduced (punctured) codeword length of 624 bits.

In some demonstrative embodiments, introduction of the new encoding rate of 7/8, e.g., based on the puncturing procedure, may provide technical benefits, for example, by solving a technical problem, for example, by allowing to even maintain a source LDPC code unchanged, and/or limiting the implementation effort and hardware complexity.

In some demonstrative embodiments, devices 102 and/or 140 may be configured to encode, generate, transmit, receive and/or process transmissions utilizing an extended LDPC codeword, e.g., having an extended codeword length of 1248 bits or any other extended codeword length, corresponding to the encoding rate of 7/8, e.g., as described below.

In some demonstrative embodiments, the LDPC code with encoding rate 7/8 and codeword length of 1248 bits may provide technical benefits, for example, when implemented, for example, together with QPSK, 16QAM, 64QAM, and 256QAM, SQPSK modulations, and/or any other additional or alternative modulation schemes, e.g., as described below.

In some demonstrative embodiments, the LDPC code with encoding rate 7/8 and codeword length of 1248 bits may provide technical benefits, for example, when implemented, for example, with channel bonding techniques, for example, 2×, 3×, and/or 4× channel bonding, and/or any other channel bonding factor, e.g., as described below.

In some demonstrative embodiments, the LDPC code with encoding rate 7/8 and codeword length of 1248 bits may provide technical benefits, for example, when implemented, for example, with channel aggregation techniques, for example, 2×, 3×, 4× channel aggregation, and/or any other channel aggregation factor, e.g., as described below.

In some demonstrative embodiments, the LDPC code with encoding rate 7/8 and codeword length of 1248 bits may provide technical benefits, for example, when implemented, for example, for a Single User MIMO (SU-MIMO) transmission, e.g., as described below.

In some demonstrative embodiments, the LDPC code with encoding rate 7/8 and codeword length of 1248 bits may provide technical benefits, for example, when implemented, for example, for a Multi User MIMO (MU-MIMO) transmission, e.g., as described below.

In some demonstrative embodiments, the extended codeword length of 1248 bits for the encoding rate of 7/8 may be obtained, for example, based on a puncturing procedure, e.g., as described below.

For example, an initial LDPC code with a codeword length of 1344 bits and an encoding rate of 13/16 may be used to determine a plurality of parity bits, e.g., as described below. For example, the first 96 bits of the parity bits may be punctured, for example, to obtain the required length of 1248 bits. Accordingly, this procedure may allow achieving the encoding rate of 7/8, for example, with a systematic data part length of 1092 bits, and a codeword length of 1248 bits.

In some demonstrative embodiments, the puncturing technique described herein may allow achieving a competitive performance for codes with an encoding rate of 7/8, for example, while preserving a limited implementation complexity required to support this encoding rate.

In some demonstrative embodiments, devices 102 and/or 140 may be configured to encode and/or decode data according to an encoding procedure utilizing an LDPC code with the encoding rate 7/8, e.g., as described below.

In one example, device 102 may be configured to encode the data and/or device 140 may be configured to decode the data, e.g., as described below.

In another example, device 140 may be configured to encode the data and/or device 102 may be configured to decode the data.

In some demonstrative embodiments, controller 124 may include, operate as, and/or perform the functionality of an encoder 129, which may be configured to encode the data, for example, according to the LDPC code with the encoding rate 7/8, e.g., as described below.

In some demonstrative embodiments, encoder 129 may include an LDPC encoder. In one example, encoder 129 may be implemented as part of transmitter 118, and/or any other element of device 102.

In some demonstrative embodiments, controller 154 may include, operate as, and/or perform the functionality of an decoder 157, which may be configured to decode the data, for example, according to the LDPC code with the encoding rate 7/8, e.g., as described below.

In some demonstrative embodiments, decoder 157 may include an LDPC decoder. In one example, decoder 157 may be implemented as part of receiver 146, and/or any other element of device 140.

In some demonstrative embodiments, encoder 129 may be configured to encode a plurality of data bits into a plurality of codewords according to an LDPC code having an encoding rate of 7/8 and a codeword length of 1248 bits, e.g., as described below.

In some demonstrative embodiments, a codeword of the plurality of codewords may include 1092 data bits and 156 parity bits, e.g., as described below. In other embodiments, the codeword may include any other number of data bits, and/or any other number of parity bits.

In some demonstrative embodiments, encoder 129 may be configured to determine the 156 parity bits, for example, based on the 1092 data bits, e.g., as described below.

In some demonstrative embodiments, encoder 129 may be configured to determine a set of parity bits, for example, by applying a code matrix to the 1092 data bits, e.g., as described below.

In one example, encoder 129 may be configured to encode 1092 systematic data bits, for example, by applying an LDPC lifting matrix, e.g., an LDPC lifting matrix configured for a codeword length of 1344 bits, e.g., as described below.

In some demonstrative embodiments, the set of parity bits may include more than 156 bits, e.g., as described below.

In some demonstrative embodiments, the set of parity bits may include 252 parity bits, e.g., as described below. In other embodiments, the set of parity bits may include any other number of parity bits.

In some demonstrative embodiments, encoder 129 may be configured to generate the codeword, for example, by appending the 156 bits of the set of parity bits to the 1092 data bits, e.g., as described below.

In some demonstrative embodiments, the 1092 data bits may include a sequence of bits denoted {S0, S1, . . . , S1091}, and encoder 129 may be configured to determine the set of 252 parity bits corresponding to the 1092 data bits to include a sequence of bits denoted {p0, p1, p2, . . . , p251}, and to generate the codeword to include a sequence of the bits {S0, S1, . . . , S1091, p96, p97, . . . , p251}, e.g., as described below.

In some demonstrative embodiments, encoder 129 may be configured to produce the codeword, for example, by discarding a first group of parity bits, e.g., the parity bits p0, p1, . . . , p95, and to append the remaining parity bits, e.g., the parity bits p96, p97, . . . , p251, to the 1092 input systematic data bits to create an LDPC codeword, e.g., as described below.

In some demonstrative embodiments, an LDPC code may be defined for an encoding rate of 7/8 with an extended codeword length, for example, an extended codeword length of 1248 bits, which may be implemented by a PHY layer, for example, in accordance with a future *IEEE 802.11ay Specification*, e.g., as described below.

In some demonstrative embodiments, the LDPC code with the encoding rate of 7/8 and the extended codeword length, e.g., of 1248 bits, may be defined, for example, based on an LDPC code ("Initial LDPC code") with an encoding rate of 13/16 and a codeword length of 672 bits, which, in turn, may be defined, for example, in accordance with an *IEEE 802.11ad Specification*, e.g., as described below.

For example, the LDPC code with the encoding rate of 13/16 and the codeword length of 672 bits may be defined, for example, by a parity check matrix ("code matrix"), e.g., as follows:

TABLE 1

| 29 | 30 | 0  | 8  | 33 | 22 | 17 | 4  | 27 | 28 | 20 | 27 | 24 | 23 |    |    |
|----|----|----|----|----|----|----|----|----|----|----|----|----|----|----|----|
| 37 | 31 | 18 | 23 | 11 | 21 | 6  | 20 | 32 | 9  | 12 | 29 | 10 | 0  | 13 |    |
| 25 | 22 | 4  | 34 | 31 | 3  | 14 | 15 | 4  | 2  | 14 | 18 | 13 | 13 | 22 | 24 |

In some demonstrative embodiments, the parity check matrix of Table 1 may include 126 rows and 672 columns.

In some demonstrative embodiments, an element of the parity check matrix of Table 1 may include a matrix of a size Z×Z.

In one example, each nonblank element i in the Table 1 may be a cyclic permutation matrix Pi of a size Z×Z, and blank entries in Table 1 may represent a zero matrix of size Z×Z.

For example, the value of Z may be equal to 42, and the matrix Pi may be obtained from a Z×Z identity matrix, for example, by cyclically shifting the columns to the right by i elements. The matrix P0 may be the Z×Z identity matrix. An empty location may denote a null submatrix of size Z×Z.

In some demonstrative embodiments, an LDPC codeword of length of 1344 bits may be defined, for example, by extending the parity check matrix, e.g., to an extended parity check matrix, denoted H, for example, using on one or more lifting matrices, e.g., as described below.

In some demonstrative embodiments, a lifting matrix may be applied to the code matrix to generate a larger matrix, for example, the matrix H, e.g., as described below.

In some demonstrative embodiments, a '0' value in the lifting matrix may act on the Z×Z cyclic-permutation matrix Pi in the code matrix, e.g., at the same location, to create a 2Z×2Z matrix, e.g., as follows:

| $i$ | $-1$ |
|---|---|
| $-1$ | $i$ |

In some demonstrative embodiments, a value of '1' in the lifting matrix may act on the Z×Z cyclic-permutation matrix Pi in the code matrix, e.g., at the same location, to create a 2Z×2Z matrix, e.g., as follows:

| $-1$ | $I$ |
|---|---|
| $i$ | $-1$ |

In some demonstrative embodiments, a value of '−1' in the lifting matrix may act on the Z×Z zero matrix in the code matrix to create a 2Z×2Z zero matrix.

In some demonstrative embodiments, an LDPC code with a length of 1344 bits may be generated, for example, by applying the following lifting matrix to the rate 13/16 LDPC code matrix of Table 1:

TABLE 2

| 1 | 0 | 1 | 1 | 1 | 1 | 0 | 0 | 1 | 1 | 0 | 1 | 1 | 0 | −1 | −1 |
| 0 | 0 | 0 | 0 | 0 | 1 | 0 | 0 | 0 | 0 | 0 | 1 | 1 | 1 | 0 | −1 |
| 1 | 0 | 1 | 1 | 0 | 1 | 0 | 1 | 0 | 0 | 1 | 0 | 1 | 0 | 0 | 0 |

In some demonstrative embodiments, an LDPC code with encoding rate 7/8 may be defined, for example, by applying a puncturing procedure to the LDPC code with encoding rate of 13/16 and the codeword length of 1344.

In some demonstrative embodiments, devices 102 and/or 140 may be configured to encode data according to an encoding procedure utilizing the LDPC code with the encoding rate 7/8, e.g., as described below.

In some demonstrative embodiments, encoder 129 may be configured, for example, to encode 1092 systematic data bits, for example, by applying an LDPC lifting matrix, e.g., the LDPC lifting matrix discussed above, to generate an LDPC of a length of 1344 bits.

In some demonstrative embodiments, encoder 129 may implement an encoding procedure to produce 252 parity bits base don the 1092 data bits, for example, the parity bits $p0$, $p1, \ldots, p251$, e.g., as described above.

In some demonstrative embodiments, encoder 129 may be configured to discard a first group of the parity bits, e.g., the parity bits numbered from 0 to 95, e.g., the parity bits $p0$, $p1, \ldots, p95$.

In some demonstrative embodiments, encoder 129 may be configured to append the remaining parity bits, e.g., the parity bits $p96, p97, \ldots, p251$, to the input systematic data bits to create an LDPC codeword, e.g., as described above.

In some demonstrative embodiments, encoder 129 may be configured to generate the LDPC code, for example, according to an encoding procedure to satisfy one or more criteria with respect to a matrix H corresponding to the LDPC codeword with length 1344, e.g., as described below.

In some demonstrative embodiments, encoder 129 may be configured to determine the 252 parity bits of the LDPC code to satisfy the following linear system of equations in matrix form:

$$H*C=0 \quad (1)$$

wherein H denotes a bit matrix of size 252 by 1344, C denotes a column bit vector of size 1344 by 1, and 0 denotes an all zero bit vector of size 252 by 1.

In some demonstrative embodiments, the bit vector C may include systematic and parity parts, e.g., the following data bits:

$$C=\{S0,S1,\ldots,S1091,p0,p1,\ldots,p251\}^T \quad (2)$$

In some demonstrative embodiments, a required rate of 7/8 may be obtained, for example, by discarding the first 96 parity bits, for example, to produce the following codeword vector:

$$C^-=\{S0,S1,\ldots,S1091,p96,p97,\ldots,p251\}^T \quad (3)$$

Accordingly, the puncturing procedure may define a new code with an effective rate of 7/8.

In some demonstrative embodiments, the linear Equation System 1 may be resolved, for example, by applying a Gauss or Gauss-Jordan elimination, and/or any other algorithm and/or calculation.

In some demonstrative embodiments, device 102 may transmit to device 104, a transmission based on the plurality of codewords having the codeword length of 1248 bits, e.g., as described below.

In some demonstrative embodiments, controller 124 may be configured to control, cause and/or trigger device 102 to transmit a transmission over a millimeter Wave (mmWave) frequency band based on the plurality of codewords encoding the plurality of data bits.

In some demonstrative embodiments, controller 124 may be configured to control, cause and/or trigger device 102 to modulate the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme. In other embodiments, device 102 may modulate the transmission according to any other modulation scheme.

In some demonstrative embodiments, controller 124 may be configured to control, cause and/or trigger device 102 to transmit the transmission over a bonded channel according to a channel bonding factor of 2, 3, or 4. In other embodiments, device 102 may use any other channel bonding factor.

In some demonstrative embodiments, the transmission may include a Single User (SU) Multiple-Input-Multiple-Output (MIMO) transmission.

In some demonstrative embodiments, the transmission may include a Multi User (MU) MIMO transmission.

In some demonstrative embodiments, device 140 may receive the transmission over the mmWave frequency band.

In some demonstrative embodiments, controller 154 may be configured to control, cause and/or trigger device 140 to process the transmission over the mmWave frequency band based.

In some demonstrative embodiments, decoder 157 may be configured to decode the transmission according to the LDPC code having the encoding rate of 7/8 and the codeword length of 1248 bits.

In some demonstrative embodiments, controller 154 may be configured to control, cause and/or trigger device 140 to receive the transmission over the bonded channel according to the channel bonding factor of 2, 3, or 4. In other embodiments, device 140 may use any other channel bonding factor.

In some demonstrative embodiments, controller 154 may be configured to control, cause and/or trigger device 140 to receive the transmission including the SU-MIMO transmission.

In some demonstrative embodiments, controller 154 may be configured to control, cause and/or trigger device 140 to receive the transmission including the MU-MIMO transmission.

In some demonstrative embodiments, controller 154 may be configured to control, cause and/or trigger device 102 to demodulate the transmission according to the QPSK scheme, the 16 QAM scheme, the 64QAM scheme, the 256QAM scheme, or the SQPSK scheme. In other embodiments, device 140 may demodulate the transmission according to any other modulation scheme.

Figure 2:
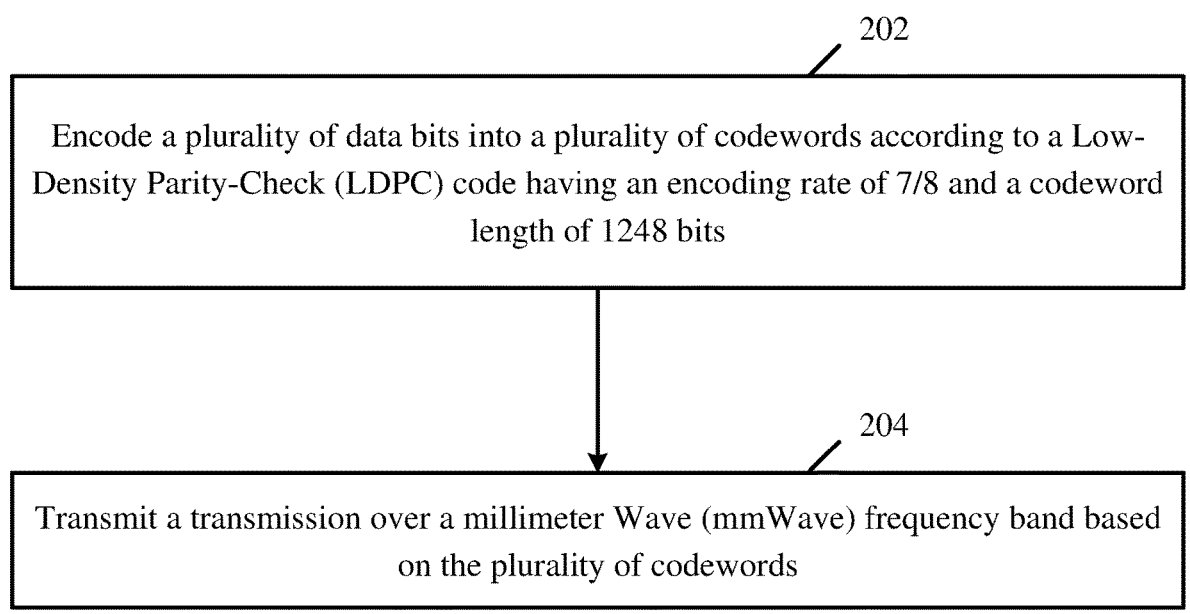
FIG. 2 is a schematic flow-chart illustration of a method of transmitting a transmission encoded according to a Low-Density Parity-Check (LDPC) code, in accordance with some demonstrative embodiments.

Reference is made to FIG. 2, which schematically illustrates a method of transmitting a transmission encoded according to an LDPC code, in accordance with some demonstrative embodiments. For example, one or more of the operations of the method of FIG. 2 may be performed by one or more elements of a system, e.g., system 100 (FIG. 1), for example, one or more wireless devices, e.g., device 102 (FIG. 1), and/or device 140 (FIG. 1); a controller, e.g., controller 124 (FIG. 1), and/or controller 154 (FIG. 1); an encoder, e.g., encoder 129 (FIG. 1); a decoder, e.g., decoder 157 (FIG. 1); a radio, e.g., radio 114 (FIG. 1), and/or radio 144 (FIG. 1); a transmitter, e.g., transmitter 118 (FIG. 1), and/or transmitter 148 (FIG. 1); a receiver e.g., receiver 116 (FIG. 1), and/or receiver 146 (FIG. 1); and/or a message processor, e.g., message processor 128 (FIG. 1), and/or message processor 158 (FIG. 1).

As indicated at block 202, the method may include encoding a plurality of data bits into a plurality of codewords according to an LDPC code having an encoding rate of 7/8 and a codeword length of 1248 bits. For example, encoder 129 (FIG. 1) may encode a plurality of the data bits into the plurality of codewords according to the LDPC code having the encoding rate of 7/8 and the codeword length of 1248 bits, e.g., as described above.

As indicated at block 204, the method may include transmitting a transmission over an mmWave frequency band based on the plurality of codewords. For example, controller 124 (FIG. 1) may control, cause and/or trigger device 102 (FIG. 1) to transmit a transmission over the mmWave frequency band based on the plurality of codewords, e.g., as described above.

Figure 3:
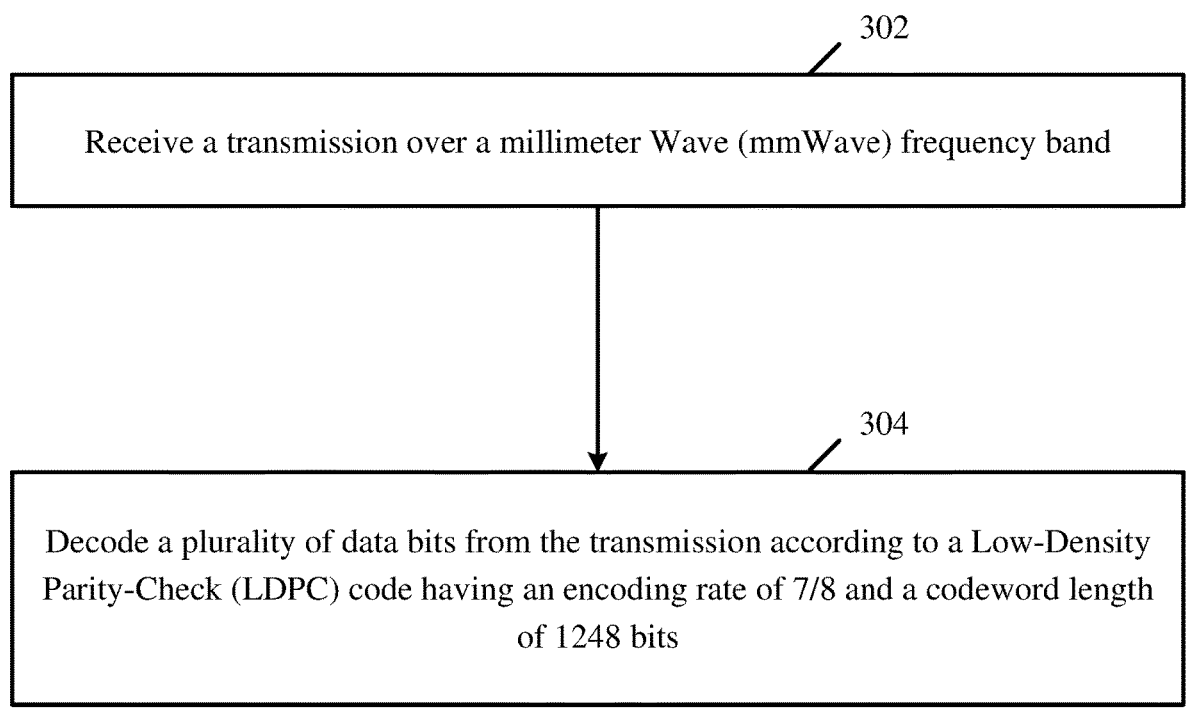
FIG. 3 is a schematic flow-chart illustration of a method of receiving a transmission encoded according to an LDPC code, in accordance with some demonstrative embodiments.

Reference is made to FIG. 3, which schematically illustrates a method of receiving a transmission encoded according to an LDPC code, in accordance with some demonstrative embodiments. For example, one or more of the operations of the method of FIG. 3 may be performed by one or more elements of a system, e.g., system 100 (FIG. 1), for example, one or more wireless devices, e.g., device 102 (FIG. 1), and/or device 140 (FIG. 1); a controller, e.g., controller 124 (FIG. 1), and/or controller 154 (FIG. 1); an encoder, e.g., encoder 129 (FIG. 1); a decoder, e.g., decoder 157 (FIG. 1); a radio, e.g., radio 114 (FIG. 1), and/or radio 144 (FIG. 1); a transmitter, e.g., transmitter 118 (FIG. 1), and/or transmitter 148 (FIG. 1); a receiver e.g., receiver 116 (FIG. 1), and/or receiver 146 (FIG. 1); and/or a message processor, e.g., message processor 128 (FIG. 1), and/or message processor 158 (FIG. 1).

As indicated at block 302, the method may include receiving a transmission over an mmWave frequency band. For example, controller 154 (FIG. 1) may control, cause and/or trigger device 140 (FIG. 1) to receive a transmission over the mmWave frequency band, e.g., as described above.

As indicated at block 304, the method may include decoding a plurality of data bits from the transmission according to an LDPC code having an encoding rate of 7/8 and a codeword length of 1248 bits. For example, decoder 157 (FIG. 1) may decode a plurality of data bits from the transmission according to the LDPC code having the encoding rate of 7/8 and the codeword length of 1248 bits, e.g., as described above.

Figure 4:
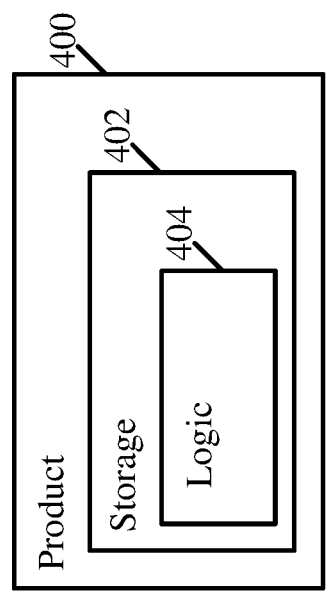
FIG. 4 is a schematic illustration of a product of manufacture, in accordance with some demonstrative embodiments.

Reference is made to FIG. 4, which schematically illustrates a product of manufacture 400, in accordance with some demonstrative embodiments. Product 400 may include one or more tangible computer-readable non-transitory storage media 402, which may include computer-executable instructions, e.g., implemented by logic 404, operable to, when executed by at least one computer processor, enable the at least one computer processor to implement one or more operations at device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), controller 124 (FIG. 1), controller 154 (FIG. 1), encoder 129 (FIG. 1), decoder 157 (FIG. 1), message processor 128 (FIG. 1), and/or message processor 158 (FIG. 1), to cause device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), controller 124 (FIG. 1), controller 154 (FIG. 1), encoder 129 (FIG. 1), decoder 157 (FIG. 1), message processor 128 (FIG. 1), and/or message processor 158 (FIG. 1), to perform one or more operations, and/or to perform, trigger and/or implement one or more operations, communications and/or functionalities described above with reference to FIGS. 1, 2, and/or 3, and/or one or more operations described herein. The phrase "non-transitory machine-readable medium" is directed to include all computer-readable media, with the sole exception being a transitory propagating signal.

In some demonstrative embodiments, product 400 and/or storage media 402 may include one or more types of computer-readable storage media capable of storing data, including volatile memory, non-volatile memory, removable or non-removable memory, erasable or non-erasable memory, writeable or re-writeable memory, and the like. For example, machine-readable storage media 402 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 404 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 404 may include, or may be implemented as, software, firmware, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

EXAMPLES

The following examples pertain to further embodiments.

Example 1 includes an apparatus comprising logic and circuitry configured to cause a wireless station to encode a plurality of data bits into a plurality of codewords according to a Low-Density Parity-Check (LDPC) code having an encoding rate of 7/8 and a codeword length of 1248 bits; and transmit a transmission over a millimeter Wave (mmWave) frequency band based on the plurality of codewords.

Example 2 includes the subject matter of Example 1, and optionally, wherein a codeword of the plurality of codewords comprises 1092 data bits and 156 parity bits, the 156 parity bits are based on the 1092 data bits.

Example 3 includes the subject matter of Example 2, and optionally, wherein the apparatus is configured to cause the wireless station to determine a set of parity bits by applying a code matrix to the 1092 data bits, the set of parity bits comprising more than 156 bits, and to generate the codeword by appending 156 bits of the set of parity bits to the 1092 data bits.

Example 4 includes the subject matter of Example 3, and optionally, wherein the code matrix comprises a lifting matrix.

Example 5 includes the subject matter of Example 3 or 4, and optionally, wherein the set of parity bits comprises 252 parity bits.

Example 6 includes the subject matter of Example 5, and optionally, wherein the 252 parity bits comprise a sequence of bits denoted $\{p0, p1, p2, \ldots, p251\}$, the 1092 data bits comprise a sequence of bits denoted $\{S0, S1, \ldots, S1091\}$, and the codeword comprises a sequence of the bits $\{S0, S1, \ldots, S1091, p96, p97, \ldots, p251\}$.

Example 7 includes the subject matter of Example 5 or 6, and optionally, wherein the apparatus is configured to cause the wireless station to determine the 252 parity bits to satisfy the following criterion H*C=0, wherein H denotes a bit matrix of size 252×1344, C denotes a column bit vector of size 1344×1, $C=\{S0, S1, \ldots, S1091, p0, p1, \ldots, p251\}^T$, the sequence $\{S0, S1, \ldots, S1091\}$ denotes the 1092 data bits, the sequence $\{p0, p1, \ldots, p251\}$ denotes the 252 parity bits, and 0 denotes an all zero bit vector of size 252×1.

Example 8 includes the subject matter of any one of Examples 1-7, and optionally, wherein the apparatus is configured to cause the wireless station to modulate the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 9 includes the subject matter of any one of Examples 1-8, and optionally, wherein the apparatus is configured to cause the wireless station to transmit the transmission over a bonded channel according to a channel bonding factor of 2, 3, or 4.

Example 10 includes the subject matter of any one of Examples 1-9, and optionally, wherein the apparatus is configured to cause the wireless station to transmit the transmission over an aggregated channel according to a channel aggregation factor of 2, 3, or 4.

Example 11 includes the subject matter of any one of Examples 1-10, and optionally, wherein the transmission comprises a Single User (SU) Multiple-Input-Multiple-Output (MIMO) transmission.

Example 12 includes the subject matter of any one of Examples 1-10, and optionally, wherein the transmission comprises a Multi User (MU) Multiple-Input-Multiple-Output (MIMO) transmission.

Example 13 includes the subject matter of any one of Examples 1-12, and optionally, wherein the wireless station is a Directional Multi-Gigabit (DMG) Station (STA).

Example 14 includes the subject matter of any one of Examples 1-13, and optionally, comprising one or more antennas, a memory, and a processor.

Example 15 includes a system of wireless communication comprising a wireless station, the wireless station comprising one or more antennas; a radio; a memory; a processor; and a controller configured to cause the wireless station to encode a plurality of data bits into a plurality of codewords according to a Low-Density Parity-Check (LDPC) code having an encoding rate of 7/8 and a codeword length of 1248 bits; and transmit a transmission over a millimeter Wave (mmWave) frequency band based on the plurality of codewords.

Example 16 includes the subject matter of Example 15, and optionally, wherein a codeword of the plurality of codewords comprises 1092 data bits and 156 parity bits, the 156 parity bits are based on the 1092 data bits.

Example 17 includes the subject matter of Example 16, and optionally, wherein the controller is configured to cause the wireless station to determine a set of parity bits by applying a code matrix to the 1092 data bits, the set of parity bits comprising more than 156 bits, and to generate the codeword by appending 156 bits of the set of parity bits to the 1092 data bits.

Example 18 includes the subject matter of Example 17, and optionally, wherein the code matrix comprises a lifting matrix.

Example 19 includes the subject matter of Example 17 or 18, and optionally, wherein the set of parity bits comprises 252 parity bits.

Example 20 includes the subject matter of Example 19, and optionally, wherein the 252 parity bits comprise a sequence of bits denoted $\{p0, p1, p2, \ldots, p251\}$, the 1092 data bits comprise a sequence of bits denoted $\{S0, S1, \ldots, S1091\}$, and the codeword comprises a sequence of the bits $\{S0, S1, \ldots, S1091, p96, p97, \ldots, p251\}$.

Example 21 includes the subject matter of Example 19 or 20, and optionally, wherein the controller is configured to cause the wireless station to determine the 252 parity bits to satisfy the following criterion H*C=0, wherein H denotes a bit matrix of size 252×1344, C denotes a column bit vector of size 1344×1, $C=\{S0, S1, \ldots, S1091, p0, p1, \ldots, p251\}^T$, the sequence $\{S0, S1, \ldots, S1091\}$ denotes the 1092 data bits, the sequence {p0, p1, ..., p251} denotes the 252 parity bits, and 0 denotes an all zero bit vector of size 252×1.

Example 22 includes the subject matter of any one of Examples 15-21, and optionally, wherein the controller is configured to cause the wireless station to modulate the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 23 includes the subject matter of any one of Examples 15-22, and optionally, wherein the controller is configured to cause the wireless station to transmit the transmission over a bonded channel according to a channel bonding factor of 2, 3, or 4.

Example 24 includes the subject matter of any one of Examples 15-23, and optionally, wherein the controller is configured to cause the wireless station to transmit the transmission over an aggregated channel according to a channel aggregation factor of 2, 3, or 4.

Example 25 includes the subject matter of any one of Examples 15-24, and optionally, wherein the transmission comprises a Single User (SU) Multiple-Input-Multiple-Output (MIMO) transmission.

Example 26 includes the subject matter of any one of Examples 15-24, and optionally, wherein the transmission comprises a Multi User (MU) Multiple-Input-Multiple-Output (MIMO) transmission.

Example 27 includes the subject matter of any one of Examples 15-26, and optionally, wherein the wireless station is a Directional Multi-Gigabit (DMG) Station (STA).

Example 28 includes a method to be performed at a wireless station, the method comprising encoding a plurality of data bits into a plurality of codewords according to a Low-Density Parity-Check (LDPC) code having an encoding rate of 7/8 and a codeword length of 1248 bits; and transmitting a transmission over a millimeter Wave (mmWave) frequency band based on the plurality of codewords.

Example 29 includes the subject matter of Example 28, and optionally, wherein a codeword of the plurality of codewords comprises 1092 data bits and 156 parity bits, the 156 parity bits are based on the 1092 data bits.

Example 30 includes the subject matter of Example 29, and optionally, comprising determining a set of parity bits by applying a code matrix to the 1092 data bits, the set of parity bits comprising more than 156 bits, and generating the codeword by appending 156 bits of the set of parity bits to the 1092 data bits.

Example 31 includes the subject matter of Example 30, and optionally, wherein the code matrix comprises a lifting matrix.

Example 32 includes the subject matter of Example 30 or 31, and optionally, wherein the set of parity bits comprises 252 parity bits.

Example 33 includes the subject matter of Example 32, and optionally, wherein the 252 parity bits comprise a sequence of bits denoted {p0, p1, p2, ..., p251}, the 1092 data bits comprise a sequence of bits denoted {S0, S1, ..., S1091}, and the codeword comprises a sequence of the bits {S0, S1, ..., S1091, p96, p97, ..., p251}.

Example 34 includes the subject matter of Example 32 or 33, and optionally, comprising determining the 252 parity bits to satisfy the following criterion H*C=0, wherein H denotes a bit matrix of size 252×1344, C denotes a column bit vector of size 1344×1, C={S0, S1, ..., S1091, p0, p1, ..., p251}$^T$, the sequence {S0, S1, ..., S1091} denotes the 1092 data bits, the sequence {p0, p1, ..., p251} denotes the 252 parity bits, and 0 denotes an all zero bit vector of size 252×1.

Example 35 includes the subject matter of any one of Examples 28-34, and optionally, comprising modulating the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 36 includes the subject matter of any one of Examples 28-35, and optionally, comprising transmitting the transmission over a bonded channel according to a channel bonding factor of 2, 3, or 4.

Example 37 includes the subject matter of any one of Examples 28-36, and optionally, comprising transmitting the transmission over an aggregated channel according to a channel aggregation factor of 2, 3, or 4.

Example 38 includes the subject matter of any one of Examples 28-37, and optionally, wherein the transmission comprises a Single User (SU) Multiple-Input-Multiple-Output (MIMO) transmission.

Example 39 includes the subject matter of any one of Examples 28-37, and optionally, wherein the transmission comprises a Multi User (MU) Multiple-Input-Multiple-Output (MIMO) transmission.

Example 40 includes the subject matter of any one of Examples 28-39, and optionally, wherein the wireless station is a Directional Multi-Gigabit (DMG) Station (STA).

Example 41 includes a product comprising one or more tangible computer-readable non-transitory storage media comprising computer-executable instructions operable to, when executed by at least one computer processor, enable the at least one computer processor to cause a wireless station to encode a plurality of data bits into a plurality of codewords according to a Low-Density Parity-Check (LDPC) code having an encoding rate of 7/8 and a codeword length of 1248 bits; and transmit a transmission over a millimeter Wave (mmWave) frequency band based on the plurality of codewords.

Example 42 includes the subject matter of Example 41, and optionally, wherein a codeword of the plurality of codewords comprises 1092 data bits and 156 parity bits, the 156 parity bits are based on the 1092 data bits.

Example 43 includes the subject matter of Example 42, and optionally, wherein the instructions, when executed, cause the wireless station to determine a set of parity bits by applying a code matrix to the 1092 data bits, the set of parity bits comprising more than 156 bits, and to generate the codeword by appending 156 bits of the set of parity bits to the 1092 data bits.

Example 44 includes the subject matter of Example 43, and optionally, wherein the code matrix comprises a lifting matrix.

Example 45 includes the subject matter of Example 43 or 44, and optionally, wherein the set of parity bits comprises 252 parity bits.

Example 46 includes the subject matter of Example 45, and optionally, wherein the 252 parity bits comprise a sequence of bits denoted {p0, p1, p2, ..., p251}, the 1092 data bits comprise a sequence of bits denoted {S0, S1, ..., S1091}, and the codeword comprises a sequence of the bits {S0, S1, ..., S1091, p96, p97, ..., p251}.

Example 47 includes the subject matter of Example 45 or 46, and optionally, wherein the instructions, when executed, cause the wireless station to determine the 252 parity bits to satisfy the following criterion H*C=0, wherein H denotes a bit matrix of size 252×1344, C denotes a column bit vector of size 1344×1, C={S0, S1, . . . , S1091, p0, p1, . . . , p251}$^T$, the sequence {S0, S1, . . . , S1091} denotes the 1092 data bits, the sequence {p0, p1, . . . , p251} denotes the 252 parity bits, and 0 denotes an all zero bit vector of size 252×1.

Example 48 includes the subject matter of any one of Examples 41-47, and optionally, wherein the instructions, when executed, cause the wireless station to modulate the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 49 includes the subject matter of any one of Examples 41-48, and optionally, wherein the instructions, when executed, cause the wireless station to transmit the transmission over a bonded channel according to a channel bonding factor of 2, 3, or 4.

Example 50 includes the subject matter of any one of Examples 41-49, and optionally, wherein the instructions, when executed, cause the wireless station to transmit the transmission over an aggregated channel according to a channel aggregation factor of 2, 3, or 4.

Example 51 includes the subject matter of any one of Examples 41-50, and optionally, wherein the transmission comprises a Single User (SU) Multiple-Input-Multiple-Output (MIMO) transmission.

Example 52 includes the subject matter of any one of Examples 41-50, and optionally, wherein the transmission comprises a Multi User (MU) Multiple-Input-Multiple-Output (MIMO) transmission.

Example 53 includes the subject matter of any one of Examples 41-52, and optionally, wherein the wireless station is a Directional Multi-Gigabit (DMG) Station (STA).

Example 54 includes an apparatus of wireless communication by a wireless station, the apparatus comprising means for encoding a plurality of data bits into a plurality of codewords according to a Low-Density Parity-Check (LDPC) code having an encoding rate of 7/8 and a codeword length of 1248 bits; and means for transmitting a transmission over a millimeter Wave (mmWave) frequency band based on the plurality of codewords.

Example 55 includes the subject matter of Example 54, and optionally, wherein a codeword of the plurality of codewords comprises 1092 data bits and 156 parity bits, the 156 parity bits are based on the 1092 data bits.

Example 56 includes the subject matter of Example 55, and optionally, comprising means for determining a set of parity bits by applying a code matrix to the 1092 data bits, the set of parity bits comprising more than 156 bits, and generating the codeword by appending 156 bits of the set of parity bits to the 1092 data bits.

Example 57 includes the subject matter of Example 56, and optionally, wherein the code matrix comprises a lifting matrix.

Example 58 includes the subject matter of Example 56 or 57, and optionally, wherein the set of parity bits comprises 252 parity bits.

Example 59 includes the subject matter of Example 58, and optionally, wherein the 252 parity bits comprise a sequence of bits denoted {p0, p1, p2, . . . , p251}, the 1092 data bits comprise a sequence of bits denoted {S0, S1, . . . , S1091}, and the codeword comprises a sequence of the bits {S0, S1, . . . , S1091, p96, p97, . . . , p251}.

Example 60 includes the subject matter of Example 58 or 59, and optionally, comprising means for determining the 252 parity bits to satisfy the following criterion H*C=0, wherein H denotes a bit matrix of size 252×1344, C denotes a column bit vector of size 1344×1, C={S0, S1, . . . , S1091, p0, p1, . . . , p251}$^T$, the sequence {S0, S1, . . . , S1091} denotes the 1092 data bits, the sequence {p0, p1, . . . , p251} denotes the 252 parity bits, and 0 denotes an all zero bit vector of size 252×1.

Example 61 includes the subject matter of any one of Examples 54-60, and optionally, comprising means for modulating the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 62 includes the subject matter of any one of Examples 54-61, and optionally, comprising means for transmitting the transmission over a bonded channel according to a channel bonding factor of 2, 3, or 4.

Example 63 includes the subject matter of any one of Examples 54-62, and optionally, comprising means for transmitting the transmission over an aggregated channel according to a channel aggregation factor of 2, 3, or 4.

Example 64 includes the subject matter of any one of Examples 54-63, and optionally, wherein the transmission comprises a Single User (SU) Multiple-Input-Multiple-Output (MIMO) transmission.

Example 65 includes the subject matter of any one of Examples 54-63, and optionally, wherein the transmission comprises a Multi User (MU) Multiple-Input-Multiple-Output (MIMO) transmission.

Example 66 includes the subject matter of any one of Examples 54-65, and optionally, wherein the wireless station is a Directional Multi-Gigabit (DMG) Station (STA).

Example 67 includes an apparatus comprising logic and circuitry configured to cause a wireless station to receive a transmission over a millimeter Wave (mmWave) frequency band; and decode a plurality of data bits from the transmission according to a Low-Density Parity-Check (LDPC) code having an encoding rate of 7/8 and a codeword length of 1248 bits.

Example 68 includes the subject matter of Example 67, and optionally, wherein a codeword of the LDPC code comprises 1092 data bits and 156 parity bits, the 156 parity bits are based on the 1092 data bits.

Example 69 includes the subject matter of Example 67 or 68, and optionally, wherein the apparatus is configured to cause the wireless station to demodulate the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 70 includes the subject matter of any one of Examples 67-69, and optionally, wherein the apparatus is configured to cause the wireless station to receive the transmission over a bonded channel according to a channel bonding factor of 2, 3, or 4.

Example 71 includes the subject matter of any one of Examples 67-70, and optionally, wherein the apparatus is configured to cause the wireless station to receive the transmission over an aggregated channel according to a channel aggregation factor of 2, 3, or 4.

Example 72 includes the subject matter of any one of Examples 67-71, and optionally, wherein the transmission comprises a Single User (SU) Multiple-Input-Multiple-Output (MIMO) transmission.

Example 73 includes the subject matter of any one of Examples 67-71, and optionally, wherein the transmission comprises a Multi User (MU) Multiple-Input-Multiple-Output (MIMO) transmission.

Example 74 includes the subject matter of any one of Examples 67-73, and optionally, wherein the wireless station is a Directional Multi-Gigabit (DMG) Station (STA).

Example 75 includes the subject matter of any one of Examples 67-74, and optionally, comprising one or more antennas, a memory, and a processor.

Example 76 includes a system of wireless communication comprising a wireless station, the wireless station comprising one or more antennas; a radio; a memory; a processor; and a controller configured to cause the wireless station to receive a transmission over a millimeter Wave (mmWave) frequency band; and decode a plurality of data bits from the transmission according to a Low-Density Parity-Check (LDPC) code having an encoding rate of 7/8 and a codeword length of 1248 bits.

Example 77 includes the subject matter of Example 76, and optionally, wherein a codeword of the LDPC code comprises 1092 data bits and 156 parity bits, the 156 parity bits are based on the 1092 data bits.

Example 78 includes the subject matter of Example 76 or 77, and optionally, wherein the controller is configured to cause the wireless station to demodulate the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 79 includes the subject matter of any one of Examples 76-78, and optionally, wherein the controller is configured to cause the wireless station to receive the transmission over a bonded channel according to a channel bonding factor of 2, 3, or 4.

Example 80 includes the subject matter of any one of Examples 76-79, and optionally, wherein the controller is configured to cause the wireless station to receive the transmission over an aggregated channel according to a channel aggregation factor of 2, 3, or 4.

Example 81 includes the subject matter of any one of Examples 76-80, and optionally, wherein the transmission comprises a Single User (SU) Multiple-Input-Multiple-Output (MIMO) transmission.

Example 82 includes the subject matter of any one of Examples 76-80, and optionally, wherein the transmission comprises a Multi User (MU) Multiple-Input-Multiple-Output (MIMO) transmission.

Example 83 includes the subject matter of any one of Examples 76-82, and optionally, wherein the wireless station is a Directional Multi-Gigabit (DMG) Station (STA).

Example 84 includes a method to be performed at a wireless station, the method comprising receiving a transmission over a millimeter Wave (mmWave) frequency band; and decoding a plurality of data bits from the transmission according to a Low-Density Parity-Check (LDPC) code having an encoding rate of 7/8 and a codeword length of 1248 bits.

Example 85 includes the subject matter of Example 84, and optionally, wherein a codeword of the LDPC code comprises 1092 data bits and 156 parity bits, the 156 parity bits are based on the 1092 data bits.

Example 86 includes the subject matter of Example 84 or 85, and optionally, comprising demodulating the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 87 includes the subject matter of any one of Examples 84-86, and optionally, comprising receiving the transmission over a bonded channel according to a channel bonding factor of 2, 3, or 4.

Example 88 includes the subject matter of any one of Examples 84-87, and optionally, comprising receiving the transmission over an aggregated channel according to a channel aggregation factor of 2, 3, or 4.

Example 89 includes the subject matter of any one of Examples 84-88, and optionally, wherein the transmission comprises a Single User (SU) Multiple-Input-Multiple-Output (MIMO) transmission.

Example 90 includes the subject matter of any one of Examples 84-88, and optionally, wherein the transmission comprises a Multi User (MU) Multiple-Input-Multiple-Output (MIMO) transmission.

Example 91 includes the subject matter of any one of Examples 84-90, and optionally, wherein the wireless station is a Directional Multi-Gigabit (DMG) Station (STA).

Example 92 includes a product comprising one or more tangible computer-readable non-transitory storage media comprising computer-executable instructions operable to, when executed by at least one computer processor, enable the at least one computer processor to cause a wireless station to receive a transmission over a millimeter Wave (mmWave) frequency band; and decode a plurality of data bits from the transmission according to a Low-Density Parity-Check (LDPC) code having an encoding rate of 7/8 and a codeword length of 1248 bits.

Example 93 includes the subject matter of Example 92, and optionally, wherein a codeword of the LDPC code comprises 1092 data bits and 156 parity bits, the 156 parity bits are based on the 1092 data bits.

Example 94 includes the subject matter of Example 92 or 93, and optionally, wherein the instructions, when executed, cause the wireless station to demodulate the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 95 includes the subject matter of any one of Examples 92-94, and optionally, wherein the instructions, when executed, cause the wireless station to receive the transmission over a bonded channel according to a channel bonding factor of 2, 3, or 4.

Example 96 includes the subject matter of any one of Examples 92-95, and optionally, wherein the instructions, when executed, cause the wireless station to receive the transmission over an aggregated channel according to a channel aggregation factor of 2, 3, or 4.

Example 97 includes the subject matter of any one of Examples 92-96, and optionally, wherein the transmission comprises a Single User (SU) Multiple-Input-Multiple-Output (MIMO) transmission.

Example 98 includes the subject matter of any one of Examples 92-96, and optionally, wherein the transmission comprises a Multi User (MU) Multiple-Input-Multiple-Output (MIMO) transmission.

Example 99 includes the subject matter of any one of Examples 92-98, and optionally, wherein the wireless station is a Directional Multi-Gigabit (DMG) Station (STA).

Example 100 includes an apparatus of wireless communication by a wireless station, the apparatus comprising means for receiving a transmission over a millimeter Wave (mmWave) frequency band; and means for decoding a plurality of data bits from the transmission according to a Low-Density Parity-Check (LDPC) code having an encoding rate of 7/8 and a codeword length of 1248 bits.

Example 101 includes the subject matter of Example 100, and optionally, wherein a codeword of the LDPC code comprises 1092 data bits and 156 parity bits, the 156 parity bits are based on the 1092 data bits.

Example 102 includes the subject matter of Example 100 or 101, and optionally, comprising means for demodulating the transmission according to a Quadrature Phase Shift Keying (QPSK) scheme, a 16 Quadrature Amplitude Modulation (QAM) scheme, a 64QAM scheme, a 256QAM scheme, or a Staggered QPSK (SQPSK) scheme.

Example 103 includes the subject matter of any one of Examples 100-102, and optionally, comprising means for receiving the transmission over a bonded channel according to a channel bonding factor of 2, 3, or 4.

Example 104 includes the subject matter of any one of Examples 100-103, and optionally, comprising means for receiving the transmission over an aggregated channel according to a channel aggregation factor of 2, 3, or 4.

Example 105 includes the subject matter of any one of Examples 100-104, and optionally, wherein the transmission comprises a Single User (SU) Multiple-Input-Multiple-Output (MIMO) transmission.

Example 106 includes the subject matter of any one of Examples 100-104, and optionally, wherein the transmission comprises a Multi User (MU) Multiple-Input-Multiple-Output (MIMO) transmission.

Example 107 includes the subject matter of any one of Examples 100-106, and optionally, wherein the wireless station is a Directional Multi-Gigabit (DMG) Station (STA).

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
   memory circuitry; and
   a processor comprising logic and circuitry configured to cause a wireless communication station (STA) to:
   encode a plurality of data bits to generate a plurality of Low-Density Parity-Check (LDPC) codewords according to an LDPC code having a code rate of 7/8 and a codeword length of 1248, an LDPC codeword of the plurality of LDPC codewords comprising a sequence of 1092 data bits followed by a sequence of 156 parity bits, the LDPC codeword to be generated by determining a sequence of 252 parity bits based on the sequence of 1092 data bits and a code matrix, which is configured for a codeword length of 1344 and a code rate of 13/16, and determining the sequence of 156 parity bits by discarding first 96 parity bits of the sequence of 252 parity bits; and
   transmit a wireless communication transmission based on the plurality of LDPC codewords.

2. The apparatus of claim 1 configured to cause the STA to determine the sequence of 252 parity bits to satisfy the following condition:

$$H*C=0,$$

wherein H denotes a matrix of size 252×1344, and wherein C denotes a column vector of size 1344×1 comprising the sequence of 1092 data bits followed by the sequence of 252 parity bits.

3. The apparatus of claim 1 configured to cause the STA to determine the sequence of 252 parity bits by applying the code matrix to a bit sequence, which comprises the sequence of 1092 data bits followed by the sequence of 252 parity bits.

4. The apparatus of claim 1 configured to cause the STA to modulate the wireless communication transmission according to a Quadrature Phase Shift Keying (QPSK) scheme, a 16 Quadrature Amplitude Modulation (QAM) scheme, or a 64QAM scheme.

5. The apparatus of claim 1 configured to cause the STA to transmit the wireless communication transmission over a channel bandwidth in a frequency band above 45 Gigahertz (GHz).

6. The apparatus of claim 5, wherein the wireless communication transmission comprises a Single User (SU) transmission.

7. The apparatus of claim 5, wherein the wireless communication transmission comprises a Multi User (MU) transmission.

8. The apparatus of claim 5, wherein the channel bandwidth comprises a channel bandwidth of 4.32 GHz or 6.48 GHz.

9. The apparatus of claim 5, wherein the channel bandwidth comprises a bonded channel bandwidth according to a channel-bonding factor of 2, 3, or 4.

10. The apparatus of claim 1, wherein the STA comprises an Extended Directional Multi-Gigabit (EDMG) STA.

11. The apparatus of claim 1 comprising a radio.

12. The apparatus of claim 1 comprising one or more antennas.

13. A product comprising one or more tangible computer-readable non-transitory storage media comprising computer-executable instructions operable to, when executed by at least one processor, enable the at least one processor to cause a wireless communication station (STA) to:
   encode a plurality of data bits to generate a plurality of Low-Density Parity-Check (LDPC) codewords according to an LDPC code having a code rate of 7/8 and a codeword length of 1248, an LDPC codeword of the plurality of LDPC codewords comprising a sequence of 1092 data bits followed by a sequence of 156 parity bits, the LDPC codeword to be generated by determining a sequence of 252 parity bits based on the sequence of 1092 data bits and a code matrix, which is configured for a codeword length of 1344 and a code rate of 13/16, and determining the sequence of 156 parity bits by discarding first 96 parity bits of the sequence of 252 parity bits; and
   transmit a wireless communication transmission based on the plurality of LDPC codewords.

14. The product of claim 13, wherein the instructions, when executed, cause the STA to determine the sequence of 252 parity bits to satisfy the following condition:

$$H*C=0,$$

wherein H denotes a matrix of size 252×1344, and wherein C denotes a column vector of size 1344×1 comprising the sequence of 1092 data bits followed by the sequence of 252 parity bits.

15. The product of claim 13, wherein the instructions, when executed, cause the STA to determine the sequence of 252 parity bits by applying the code matrix to a bit sequence, which comprises the sequence of 1092 data bits followed by the sequence of 252 parity bits.

16. The product of claim 13, wherein the instructions, when executed, cause the STA to modulate the wireless communication transmission according to a Quadrature Phase Shift Keying (QPSK) scheme, a 16 Quadrature Amplitude Modulation (QAM) scheme, or a 64QAM scheme.

17. The product of claim 13, wherein the instructions, when executed, cause the STA to transmit the wireless communication transmission over a channel bandwidth in a frequency band above 45 Gigahertz (GHz).

18. The product of claim 17, wherein the wireless communication transmission comprises a Single User (SU) transmission.

19. The product of claim 17, wherein the wireless communication transmission comprises a Multi User (MU) transmission.

20. The product of claim 17, wherein the channel bandwidth comprises a channel bandwidth of 4.32 GHz or 6.48 GHz.

21. The product of claim 17, wherein the channel bandwidth comprises a bonded channel bandwidth according to a channel-bonding factor of 2, 3, or 4.

22. The product of claim 13, wherein the STA comprises an Extended Directional Multi-Gigabit (EDMG) STA.

23. An apparatus comprising:
means for causing a wireless communication station (STA) to encode a plurality of data bits to generate a plurality of Low-Density Parity-Check (LDPC) codewords according to an LDPC code having a code rate of 7/8 and a codeword length of 1248, an LDPC codeword of the plurality of LDPC codewords comprising a sequence of 1092 data bits followed by a sequence of 156 parity bits, the LDPC codeword to be generated by determining a sequence of 252 parity bits based on the sequence of 1092 data bits and a code matrix, which is configured for a codeword length of 1344 and a code rate of 13/16, and determining the sequence of 156 parity bits by discarding first 96 parity bits of the sequence of 252 parity bits; and
means for causing the STA to transmit a wireless communication transmission based on the plurality of LDPC codewords.

24. The apparatus of claim 23 comprising means for causing the STA to determine the sequence of 252 parity bits by applying the code matrix to a bit sequence, which comprises the sequence of 1092 data bits followed by the sequence of 252 parity bits.

* * * * *